United States Patent
Lin et al.

(10) Patent No.: US 6,605,528 B1
(45) Date of Patent: *Aug. 12, 2003

(54) POST PASSIVATION METAL SCHEME FOR HIGH-PERFORMANCE INTEGRATED CIRCUIT DEVICES

(75) Inventors: Mou-Shiung Lin, Hsinchu (TW); Ming-Ta Lei, Hsinchu (TW); Jin-Yuan Lee, Hsinchu (TW); Ching-Cheng Huang, Hsin-Chu (TW)

(73) Assignee: Megic Corporation, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/004,027

(22) Filed: Oct. 24, 2001

Related U.S. Application Data

(63) Continuation-in-part of application No. 09/691,497, filed on Oct. 18, 2000, now Pat. No. 6,495,442.

(51) Int. Cl.[7] .......................................... H01L 21/4763
(52) U.S. Cl. .................... 438/618; 438/622; 438/637; 438/642; 257/750; 257/758
(58) Field of Search ............... 438/618, 622, 438/625, 637, 642, 652, 669; 257/750, 758

(56) References Cited

U.S. PATENT DOCUMENTS

| | | | |
|---|---|---|---|
| 5,055,907 A | 10/1991 | Jacobs | 357/71 |
| 5,106,461 A | 4/1992 | Volfson et al. | 205/125 |
| 5,212,403 A | 5/1993 | Nakanishi et al. | 257/664 |
| 5,372,967 A | 12/1994 | Sundaram et al. | 437/60 |
| 5,501,006 A | 3/1996 | Gehman, Jr. et al. | 29/840 |
| 5,576,680 A | 11/1996 | Ling | 336/200 |
| 5,635,767 A | 6/1997 | Wenzel et al. | 257/778 |
| 5,686,764 A | 11/1997 | Fulcher | 527/778 |
| 5,884,990 A | 3/1999 | Burghartz et al. | 336/200 |
| 6,008,102 A | 12/1999 | Alford et al. | 438/381 |
| 6,180,426 B1 * | 1/2001 | Lin | 438/15 |
| 6,303,423 B1 * | 10/2001 | Lin | 438/238 |

* cited by examiner

*Primary Examiner*—Kevin M. Picardat
(74) *Attorney, Agent, or Firm*—George O. Saile; Stephen B. Ackerman

(57) ABSTRACT

A new post-passivation metal interconnect scheme is provided over the surface of a IC device that has been covered with a conventional layer of passivation. The metal scheme of the invention comprises, overlying a conventional layer of passivation, thick and wide metal lines in combination with thick layers of dielectric and bond pads. The interconnect system of the invention can be used for the distribution of power, ground, signal and clock lines from bond pads to circuits of a device that are provided in any location of the IC device without introducing significant power drop. No, or smaller ESD circuits are required due to the low impedance post-passivation interconnection, since any accumulated electrostatic discharge will be evenly distributed across all junction capacitance of the circuits on the chip. The post passivation metal scheme is connected to external circuits through bond pads, solder bonding, TAB bonding and the like. A top layer of the interconnect metal scheme is formed using a composite metal for purposes of wirebonding, the composite metal is created over a bulk conduction metal. A diffusion metal may be applied between the bulk metal and the composite metal, in addition a layer of Under-Barrier-Metal (UBM) may be required underneath the bulk conduction metal.

69 Claims, 4 Drawing Sheets

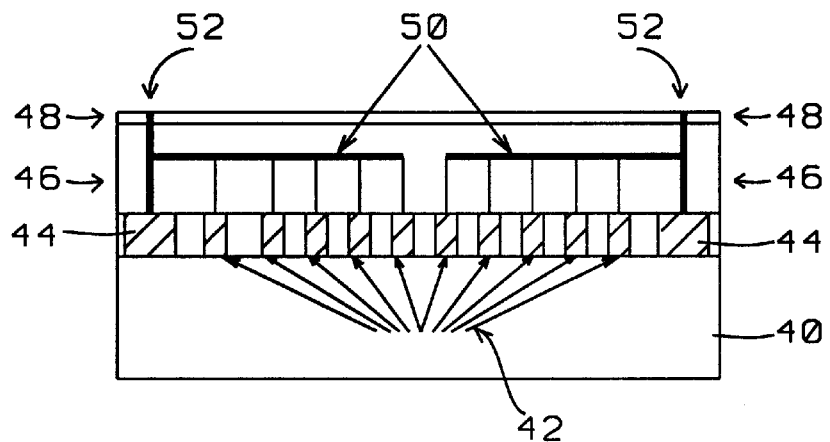
FIG. 1 - Prior Art
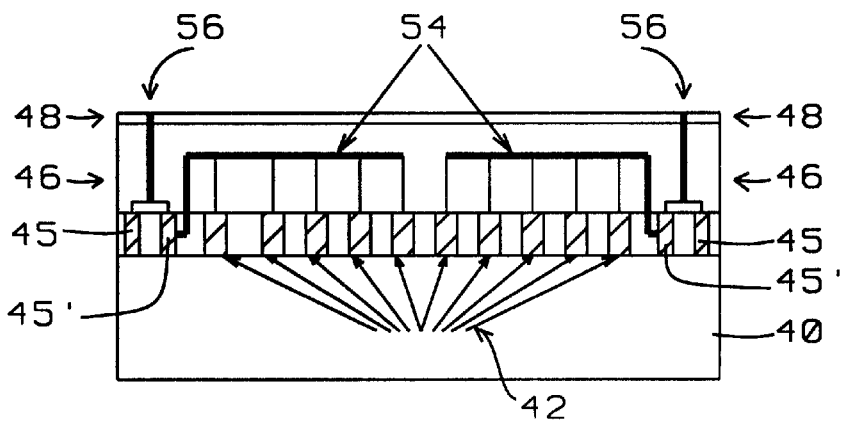
FIG. 2 - Prior Art
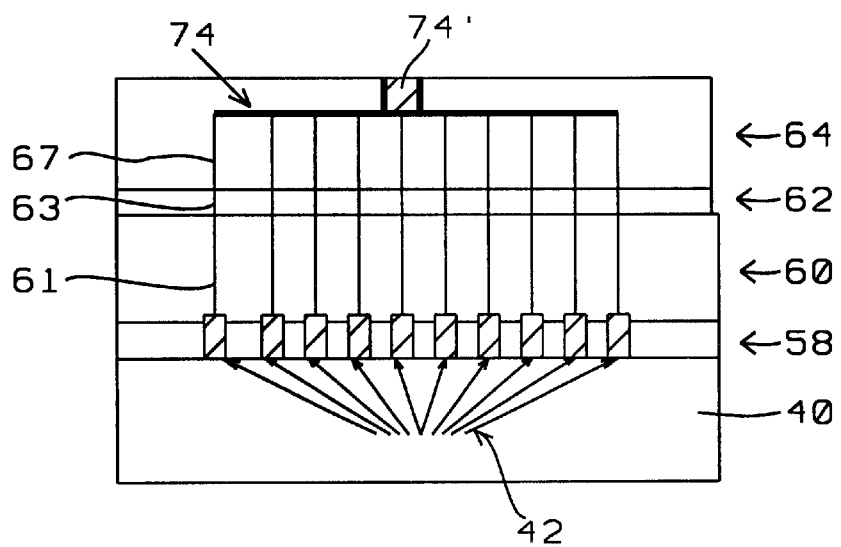
FIG. 3

POST PASSIVATION METAL SCHEME FOR HIGH-PERFORMANCE INTEGRATED CIRCUIT DEVICES

This application is a Continuation-in-Part of MEG00-005, filed on Oct. 18, 2000, Ser. No. 09/691,497, now U.S. Pat. No. 6,495,442 assigned to a common assignee.

RELATED PATENT APPLICATION

This application is related to MEG01-010, Ser. No. 09/998,862, filed on Oct. 24, 2001, assigned to a common assignee.

BACKGROUND OF THE INVENTION

(1) Field of the Invention

The invention relates to the fabrication of integrated circuit devices, and more particularly, to a post passivation scheme that provides low-resistance metal interconnects in addition to bond pads on the surface of an Integrated Circuit device that is covered with a conventional layer of passivation.

(2) Description of the Prior Art

Improvements in semiconductor device performance are typically obtained by scaling down geometric dimensions of the Integrated Circuit (IC) devices, resulting in decreasing the cost per device while improving device performance. Metal connections, which connect the Integrated Circuit to other circuit or system components, become of relative more importance and have, with the further miniaturization of the IC, an increasingly negative impact on device performance. Parasitic capacitance and resistance of the metal interconnections increase, which degrades the chip performance significantly. Of most concern in this respect is the voltage drop along the power and ground buses and the RC delay of the critical signal paths. Attempts to reduce metal interconnect resistance by using wider metal lines result in higher capacitance of these wires.

To solve this problem, one approach has been is to develop low resistance metal (such as copper) for the wires while low dielectric materials are used in between signal lines. Current practice is to create metal interconnection networks under a layer of passivation. This approach however limits the interconnect network to fine-line interconnects, which is associated with low parasitic capacitance and high line resistance. The latter two parameters, because of their relatively high values, degrade device performance, an effect which becomes even more severe for high-frequency applications and for long interconnect lines that are, for instance, typically used for clock distribution lines. Also, fine-line interconnect metal cannot carry high values of current that is typically needed for ground busses and for power busses.

It has previously been stated that it is of interest to the semiconductor art to provide a method of creating interconnect lines that removes typical limitations that are imposed on the interconnect wires, such as unwanted parasitic capacitances and high interconnect line resistance. The invention provides such a method. An analogy can be drawn in this respect, as follows: the currently used fine-line interconnection schemes, which are created under a layer of passivation, are the streets in a city. In the post-passivation interconnection scheme of the present invention, the interconnections that are created above a layer of passivation can be considered the freeways between cities.

Due to the current trend in the creation of IC devices, the interconnection metal lines become thinner and the operating voltages that are applied to the devices become lower. For current sub-micron devices, with interconnect lines having a cross-section of about 0.18 $\mu$m, the voltage that is applied to the internal circuits is typically about 2.0 Volts or less. For such low voltage supplies, the IR voltage drop that is introduced by the interconnect lines has a relatively large impact on device functionality and performance, this in particular for circuits within a device that are removed by a considerably distance from bond pads. Most seriously affected are circuits that are located in the center of a device with wire-bonding pads located at the periphery of a chip, for those devices the IR drop that is introduced by interconnect lines can cause either device malfunction or a degradation in the operational speed of the device. The invention addresses these concerns.

SUMMARY OF THE INVENTION

A principle objective of the invention is to provide a low impedance metal interconnect system with bond pads on top of a Integrated Circuit device that is covered with a conventional layer of passivation.

Another objective of the invention is to provide a scheme for metal interconnects with bond pads that negates the effects of IR voltage drops introduced by the interconnect wires for applications where a voltage supply of 2 Volts or less is used.

Yet another objective of the invention is to provide a low-cost, high-performance post passivation metal interconnection system with bond pads that allows interconnection of power, ground, signal and clock lines over long distances.

A still further objective of the invention is to provide a low-cost, high-performance post passivation metal interconnection system that allows interconnection of power, ground, signal and clock lines to relatively far removed bond pads without introducing significant IR voltage drop introduced by the metal interconnect system.

In accordance with the objectives of the invention a new post-passivation metal interconnect scheme is provided over the surface of an IC device that has been covered with a conventional layer of passivation. The metal scheme of the invention comprises, overlying a conventional layer of passivation, thick and wide metal lines in combination with thick layers of dielectric and bond pads. The interconnect system of the invention can be used for the distribution of power, ground, signal and clock lines from bond pads to circuits of a device that are provided in any location of the IC device without introducing significant power drop. The post passivation metal scheme is connected to external circuits through wirebonding pads, solder bonding, TAB bonding and the like. A top layer of the interconnect metal scheme is formed using a composite metal for purposes of wirebonding. The composite metal is created by a bulk (low-resistance) conduction metal covered by a layer of (wire-bondable) metal to which wire bond connections can be readily made. A diffusion metal may be applied between the bulk metal and the wire-bondable metal, in addition a layer of Barrier-Metal (BM) may be required underneath the bulk conduction metal.

BRIEF DESCRIPTION OF THE DRAWINGS

FIG. 1 is a cross section of a silicon substrate over which a prior art fine-line interconnect network is created over which a layer of passivation is deposited, power and/or ground pins are provided through the layer of passivation for external connection. The structure that is shown in cross section in FIG. 1 addresses prior art power and ground distribution networks.

FIG. 2 is a cross section of a silicon substrate over which a prior art fine-line interconnect network is created over which a layer of passivation is deposited, clock and/or signal pins are provided through the layer of passivation for external connection. The structure that is shown in cross section in FIG. 2 addresses prior art clock and signal distribution networks.

FIG. 3 is a cross section of a silicon substrate over which an interconnect network is created according to the invention, no ESD-circuit is provided as part of the structure. A power/ground contact pad is provided through the surface of a layer of dielectric for external connection. The structure that is shown in cross section in FIG. 3 addresses only power and ground distribution networks of the invention.

DESCRIPTION OF THE PREFERRED EMBODIMENTS

Figure 4:
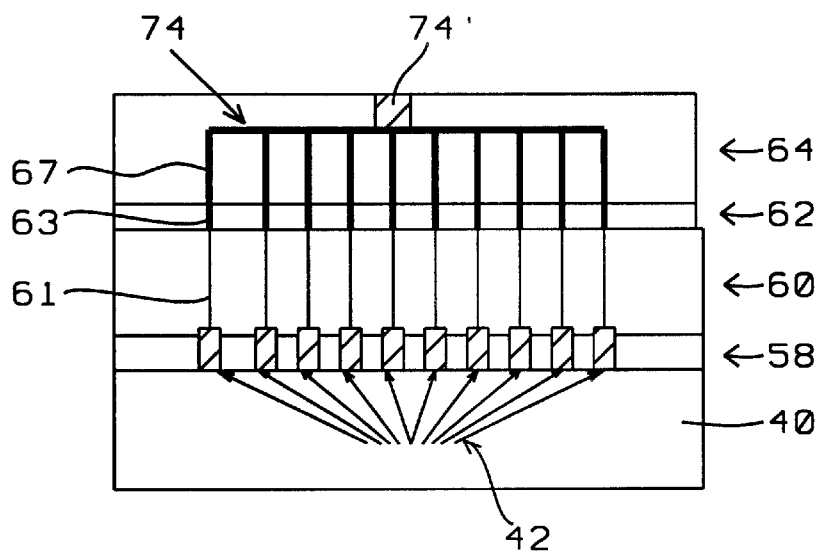
FIG. 4 is a cross section of a silicon substrate over which an interconnect network is created according to the invention, no EDS circuit is provided as part of the structure. A contact pad is provided through the surface of a layer of dielectric for external connection. The structure that is shown in cross section in FIG. 4 addresses clock and signal distribution networks of the invention.

FIG. 1 shows a cross section of a silicon substrate on the surface of which has been created a conductive interconnect network. The structure that is shown in cross section in FIG. 1 addresses prior art power and ground distribution networks. The various features that have been highlighted in FIG. 1 are the following:

- 40, a silicon substrate on the surface of which has been created an interconnect network
- 42, a sample number of semiconductor circuits that have been created in or on the surface of the substrate 40
- 44, two electrostatic discharge (ESD) circuits created in or on the surface of the substrate 40, one ESD circuit is provided for each pin that is accessible for external connections (pins 52, see below)
- 46 is a layer of interconnect lines; these interconnect lines are above the surface of substrate 40 and under the layer 48 of passivation and represent a typical application of prior art fine-line interconnects; these fine-line interconnects of layer 46 typically have high resistance and high parasitic capacitance
- 48 is a layer of passivation that is deposited over the surface of the layer 46 of interconnect lines; this conventional layer 48 of passivation is used to protect the underlying devices and the underlying fine-line interconnections
- 50 is a power or ground bus that connects to the circuits 42 via fine-line interconnect lines provided in layer 46; this power or ground bus is typically of wider metal since this power or ground bus carries the accumulated current or ground connection for the devices 42
- 52 are two power or ground pins that pass through the layer 48 of passivation and that have been connected to the power or ground bus 50.

From the above the following can be summarized: circuits are created in or on the surface of a silicon substrate, interconnect lines are created for these circuits for further interconnection to external circuitry. The circuits are, on a per I/O pin basis, provided with an ESD circuit, these circuits with their ESD circuit are connected to a power or ground pin that penetrates a layer of passivation. The layer of passivation is the final layer that overlies the created interconnect line structure, the interconnect line underneath the layer of passivation are fine line interconnects and have all the electrical disadvantages of fine line interconnects such as high resistance and high parasitic capacitance.

Relating to the cross section that is shown in FIG. 1, the following comments applies: ESD circuits are, as is known in the art, provided for the protection of semiconductor circuits against unexpected electrical charges. For this reason, each pin that connects to a semiconductor circuit must be provided with an ESD circuit.

FIG. 2 shows a cross section of a prior art configuration that resembles the cross section shown in FIG. 1. The structure that is shown in cross section in FIG. 2 however addresses clock and signal distribution networks. FIG. 2 shows, in addition to the previously highlighted aspects of FIG. 1, the following elements:

- 45 are two ESD circuits that are provided in or on the surface of the substrate 40; ESD circuits are always required for any external connection to an input/output (I/O) pin
- 45' which are circuits that can be receiver or driver or I/O circuits for input (receiver) or output (driver) or I/O purposes respectively
- 54 is a clock or signal bus, and
- 56 are clock or signal pins that have been extended through the layer 48 of passivation.

The same comments apply to the cross section that is shown in FIG. 2 as previously have been made with respect to FIG. 1, with as a summary statement that the layer of passivation is the final layer that overlies the created structure. The interconnect lines underneath the layer of passivation are fine line interconnects and have all the electrical disadvantages of fine line interconnects such as high resistance and high parasitic capacitance.

Further applies to the cross section that is shown in FIG. 2, where pins 56 are signal or clock pins:

- pins 56 must be connected to ESD and driver/receiver or I/O circuits 45
- for signal or clock pins 56, these pins must be connected not only to ESD circuits but also to driver or receiver or I/O circuits, highlighted as circuit 45' in FIG. 2
- after (clock and signal) stimuli have passed through the ESD and driver/receiver or I/O circuits, these stimuli are further routed using, under prior art methods, fine-line interconnect wires. A layer of passivation is deposited over the dielectric layer in which the interconnect network has been created.

It is therefore of interest to the semiconductor art to provide a method of creating interconnect lines that removes typical limitations that are imposed on the interconnect wires, such as unwanted parasitic capacitances and high interconnect line resistance. In addition, a method must be provided whereby various types of interconnect lines can be connected to bond pads without thereby introducing negative effects of voltage drop or parasitic (resistive and/or capacitive) components. The invention provides such a method, which will now be described in detail using FIGS. 3 and 4.

Referring now specifically to FIG. 3, this figure refers to power and ground interconnects. There is shown in FIG. 3 a cross section of a silicon substrate 40 over which a interconnect network is created according to the invention, with a wide and thick wire interconnect network created over a layer of passivation. A bond pad is provided through the surface of the thick layer of dielectric for external connection. Following are the various elements that are shown in FIG. 3:

- 40 is the silicon substrate on the surface of which interconnect lines are created in accordance with the invention
- 42 are semiconductor circuits that are created in or on the surface of substrate 40
- 58 are connection pads to the semiconductor devices 42 that have been created in or on the surface of substrate 40
- 60 is a layer of fine-line interconnects that has been created overlying connection pads 58 to the semiconductor devices 42
- 61 is one of the vias or a local fine line interconnections that have been provided for layer 60, more such vias or local fine line interconnections are shown in FIG. 3 but are, for reasons of simplicity, not highlighted
- 62 is a layer of passivation that has been deposited overlying the layer 60 of fine-line interconnects
- 63 is one of vias that passes through layer 62 of passivation, more such vias are shown in FIG. 3 but are, for reasons of simplicity, not highlighted
- 64 is a layer of post-passivation dielectric in which, as a post-passivation metal scheme process, interconnects have been created; in some applications, the metal can also be created directly on top of the layer 62 of passivation
- 74 is the combined (for multiple connection pads in layer 58) power or ground bus
- 67 is a via or a local thick metal scheme that is created overlying the layer 62 of passivation, more such vias or local thick metal schemes are shown in FIG. 3 but are, for reasons of simplicity, not highlighted
- 74' is the power or ground bond pad for the multiple semiconductor devices in layer 58.

From the cross section that is shown in FIG. 3, it is clear that, most importantly, the ability to create interconnects to semiconductor devices that have been created in or on the surface of a substrate has been extended. This by creating these interconnects not only as fine-line interconnects in layer 60 but by extending the interconnect by creation a wide, thick wire interconnect network overlying a layer of passivation. The layer of passivation is used to protect the underlying semiconductor devices and the fine line interconnection from mobile ions, moisture and other contaminants. No further passivation layer is required to protect the wide, thick metal and the dielectrics because the structure is sturdier. Moisture and mobile ions will not significantly affect the properties and functionality of the structure. The wide, thick wire interconnect network is further is connected to a power/ground bond pad 68.

This provides immediate and significant benefits in that these wide, thick lines are further removed from the surface of the substrate while the wide, thick interconnect network that is created overlying the layer of passivation can now contain sturdier, that is thicker and wider lines. Power/ground interconnect lines are in addition directly connected to a power/ground bond pad. The thick, wide metal interconnect lines in combination with the power/ground pad can be used for power and ground distribution and for connection of ground/power signals to the semiconductor devices 42. This distribution of interconnect lines and the interconnect to a ground/power bond pad takes place above a conventional layer of passivation and partially replaces and extends the conventional method of having, for purposes of ground/power distribution, a fine-line distribution interconnect network under the layer of passivation.

Prior Art provides an ESD circuit for each pin that is used for external input/output interconnect provides, after ESD stimuli have passed in parallel through the ESD circuits, a fine-line interconnect network for further distribution of the power and ground stimuli, and the fine-line power and ground distribution network is created underneath a layer of passivation.

It must, in this respect and related to the above provided comments, be remembered that power and ground pins do not require drivers and/or receiver circuitry.

The invention does not need to create an ESD circuit for each pin that is used for external input/output interconnect; this in view of the more robust wiring and the power/ground bond pad that drives the ESD circuit, resulting in reduced power loss by an unexpected power surge over the interconnect line, resulting in more power being delivered to an ESD circuit, and allows for the power and ground interconnects to be directly connected to the internal circuits of a semiconductor device, this either without an ESD circuit or with a smaller than regular ESD circuit (as previously explained).

The method that is used to create the interconnect network that is shown in cross section in FIG. 3 addresses the use of power and ground connections. FIG. 3 can be summarized as follows: a silicon substrate is provided in the surface of which have been created semiconductor devices and no electrostatic discharge (ESD) circuit. A first layer of dielectric is deposited over the substrate, a fine-line interconnect network is created in the first layer of dielectric making contact with the active circuits. A layer of passivation is deposited over the surface of the first layer of dielectric. A pattern of metal plugs (or, for low aspect ratio vias and as previously pointed out, direct interconnects between the overlying layers of metal) is created in the layer of passivation that aligns with points of contact created in the surface of the first layer of dielectric. One or more layers of dielectric are deposited over the surface of the layer of passivation, a wide thick line interconnect network is created in the one or more layers of dielectric, contacting the ESD and conventional circuits of the device. For some applications, the first layer of metal of the post-passivation interconnection scheme can be created on top of the passivation, without adding thick dielectric in between. A bond pad serving as a point of electrical contact comprising a power or ground contact is provided in or on the surface of the one or more layers of dielectric.

FIG. 3 shows, as highlighted and in summary, a cross section of a silicon substrate 40 over which a interconnect network is created according to the invention, with the interconnect network created in a thick layer of dielectric overlying a layer of passivation and remaining internal to the thick layer of dielectric. No ESD, receiver, driver or I/O circuit access pin is provided through the surface of the layer of dielectric for external to internal interface. Shown in FIG. 3 is the power/ground bus interconnect line 74, providing for an interconnect scheme of thick, wide lines overlying a passivation layer 62. Due to the thick, wide lines of the interconnect network that is created overlying a layer 62 of passivation, the power/ground distribution can take place entirely within the interconnect layer 64. If there is ESD stimuli, it will be spread out and be dissipated through all the junction of circuits 42. This can be achieved through all the low impedance metal scheme of the invention. For fine line interconnections, the ESD stimuli cannot be distributed and would destroy the junction near the I/O pin. In addition and as highlighted in the cross section of FIG. 3, the power/ground bus 74 is connected to a bond pad 74', allowing direct and relatively loss-free connection of the power/ground signals to the semiconductor circuits 42.

The reason why the circuit configuration that is shown in the cross section of FIG. 3 does not required the use of ESD circuits is basically attributable to the very low impedance of the post-passivation interconnect provided by the invention. That is layer 64, FIG. 3, which is a layer of post-passivation dielectric in which, as a post-passivation metal scheme process of the invention, interconnects have been created. The accumulated electrostatic discharge will be evenly distributed to the circuits 42 without thereby experiencing a significant resistance. The junction capacitance of all the circuits act as a collective and relatively large ESD circuit, that is the collective junction capacitance of circuits 42 is large enough that no ESD circuit is required. In prior art fine-line interconnect applications, the electrostatic charge will find the path of lowest resistance, which is the circuit that is close to the bond pad of the device, and destroy that circuit. This chain of events of prevented by the post-passivation interconnect scheme of the invention.

Figure 6:
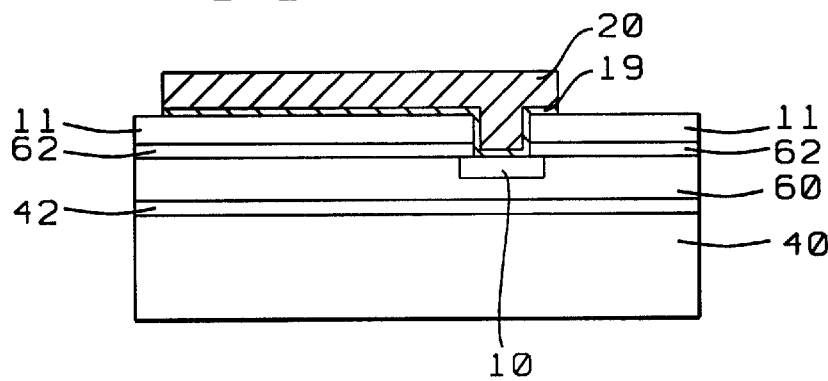
FIGS. 6 through 10 shows five structures of the invention for creating overlying layers of interconnect metal thereby including a wirebonding pad.

The cross section that is shown in FIG. 4 is identical to the cross section that has been shown in FIG. 3, the difference being that the cross section shown in FIG. 4 provides for clock/signal pulses provided over clock/signal bus 74 and the bond pad 74'. The method that is followed for the creation of the structure that is shown in cross section in FIG. 6 is therefore the same as the previously highlighted method that is used for the creation of the structure of FIG. 3.

It must further be emphasized that, where FIGS. 3 and 4 show a fine-line interconnect network 60 that underlies the layer 62 of passivation, the invention also enables for and can be further extended with the complete elimination of the fine-line interconnect network 60 and creating an interconnect network 64 that uses only thick, wide wires. For this application of the invention, the first layer of dielectric 60 is not applied, the layer 62 of passivation is deposited directly over the surface of the created semiconductor devices 58 in or on the surface of substrate 40.

It is further of value to briefly discuss the above implemented and addressed distinction between fine-line interconnect lines and wide, thick interconnect lines. The following points apply in this respect:

- the prior art fine line interconnect lines are created underneath a layer of passivation, the wide, thick interconnect lines of the invention are created above a first and second layer of passivation
- the fine-line interconnect lines are typically created in a layer of inorganic dielectric, the thick wide interconnect lines are typically created in a layer of dielectric comprising polymer. This because an inorganic material cannot be deposited as a thick layer of dielectric because such a layer of dielectric would develop fissures and crack as a result
- fine-line interconnect metal is typically created using methods of sputter with resist etching or of damascene processes using oxide etch with electroplating after which CMP is applied. Either one of these two approaches cannot create thick metal due to cost considerations or oxide cracking
- thick, wide interconnect lines can be created by first sputtering a thin metal base layer, coating and patterning a thick layer of photoresist, applying a thick layer of metal by electroplating, removing the patterned photoresist and performing metal base etching (of the sputtered thin metal base). This method allows for the creation of a pattern of very thick metal, metal thickness in excess of 1 $\mu$m can in this manner be achieved while the thickness of the layer of dielectric in which the thick metal interconnect lines are created can be in excess of 2 $\mu$m
- the thick, wide metal is formed after formation of the layer of passivation. The semiconductor devices and the fine line interconnection are already well protected by the layer of passivation from mobile ions, moisture and other contaminants. The wide, thick wire can then be formed using unconventional processes which however in most Integrated Circuit fabrication facilities are restrictive in use in for instance applying polymers, Au, Cr, Ni dry film etc. Furthermore, environmental requirements during fabrication can be relaxed.

This completes discussion of the various structures that are provided by the invention. The post-passivation interconnection scheme can be a single layer of metal or can be more than one layer of metal. Where a single layer of metal is used, the post-passivation interconnection scheme provides both low-resistance interconnection and bond pad capabilities. For applications using more than one layer of metal, the bottom layer of metal is provided for low-resistance interconnect purposes while the top layer of metal provides both low resistance interconnect and bond pad capabilities.

Figure 5:
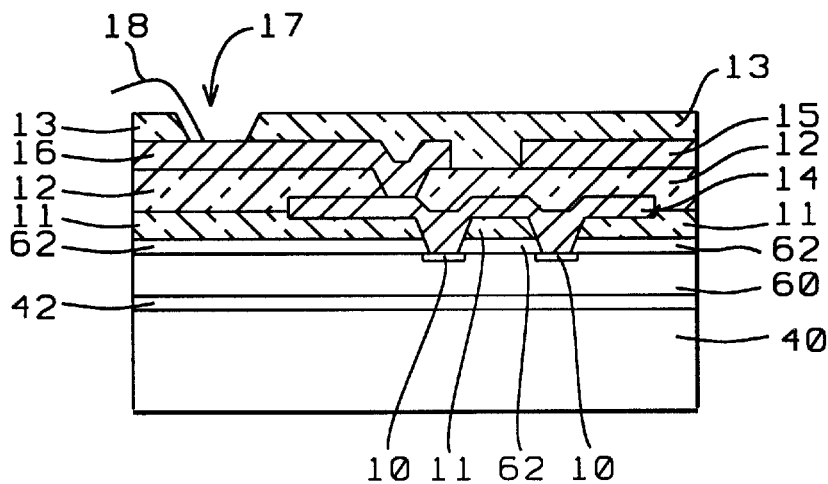
FIG. 5 shows a cross section of several overlying and interconnected layers of interconnect metal and a bond pad used by the invention for the creation of interconnect metal above the surface of a layer of passivation.

The bond pads, such as are highlighted as elements 74' in FIG. 3 and 74' in FIG. 4, can be connected to external circuits by solder bonding, wirebonding, tape-automated bonding (TAB) and the like. As an example, the bond pad exposed through opening 17, FIG. 5, is connected to external circuitry by means of bond wire 18. To achieve both the low-resistance interconnect and wire-bonding capabilities, the top layers 15/16 in FIG. 5, must comprise a first metal, for instance copper, for purposes of low-resistance, and a second metal, for example Au, for purposes of wire-bonding. A layer of metal, for instance Ni, is required as a diffusion barrier. Where a layer of copper is used, a layer of adhesion material, such as Cr, must be created underneath the layer of copper. The top layer of metal preferably comprises a composite layer of metal such as Cr/Cu/Ni/Au. Where a bottom layer of metal, such as layer 14 in FIG. 5, is only used for low-resistance conduction, only low-resistance copper is required for this layer. A layer of Cr may also be required underneath the layer of low-resistance copper for adhesion purposes while a layer of Ni is required overlying the layer of low-resistance copper for applications where protection of the surface of the layer of copper is required.

In sum: for purposes of providing both wire-bonding capabilities and of achieving low IR voltage drop along the interconnections, the metallurgy of the top layer of metal requires a bulk conduction metal such as copper, gold, aluminum, and the like, in addition to a wire bondable metal such as gold and aluminum is required. In addition, a layer of diffusion barrier material, such a Ni, is required between and overlying the bulk conduction metal and the wire-bondable metal. Furthermore, a layer of adhesion material and a barrier layer may also be required under the bulk conduction metal.

For some applications, the low-resistance metal, such as Au and Al, can also be used for wire-bonding purposes, in which case, the metallurgy becomes simpler. As an example, layer 14 and 15, FIG. 5, can both comprise TiW/Au whereby TiW is used as the adhesion layer.

First highlighted will be the cross section that is shown in FIG. 5, this cross section is to be viewed as an example of creating overlying interconnects through one or more layers of dielectric, highlighted in the cross section of FIG. 5 are:

40, the cross section of the surface of a silicon substrate 42, active semiconductor devices that have been created in or on the surface of substrate 40

60, a layer of dielectric in and through which fine-line interconnect wires have been created; these interconnect wires make contact with the underlying active semiconductor devices 42 and have in addition been provided with points of electrical contact or top metal in the surface of layer 60

10, two examples of top metal that has been provided in the surface of layer 60, making contact with the fine-line interconnect wires that have been created in layer 60

62, a layer of passivation deposited over the surface of layer 60, including the surface of top metal contacts 10; the passivation layer 62 is used to protect the underlying active devices (layer 42) and the fine-line interconnections (layer 60 of dielectric)

11, 12 and 13 respectively a first, a second and a third thick layer of dielectric; these three layers of dielectric significantly are created over the surface of layer 62 of passivation and are the layers of dielectric in and through which the thick interconnect metal of the invention is created, including at least one contact pad in the surface of the upper layer of dielectric that makes electrical contact with the thick interconnect metal of layers 11, 12 and 13; for purposes of cost-reduction, the layer 11 can be omitted, i.e. the layer 14 of metal is directly formed on the surface of the layer 62 of passivation 14, a first layer of patterned and etched metal overlying first layer 11 of dielectric and being in contact with top metal 10 by means of openings created through the first layer 11 of dielectric and the layer 62 of passivation 15 and 16, a second layer of patterned and etched metal overlying second layer 12 of dielectric and being in contact with the first layer 14 of patterned and etched metal by means of openings created through the second layer 12 of dielectric; layer 16 can for instance serve as a contact pad, layer 15 provides further interconnect to surrounding circuitry (not shown); layers 15 and 16 can be used for purposes other than forming contacts, these layers can also be used as conductive layers such as layers of signal interconnects 17, an opening created through the third layer 13 of dielectric, exposing the surface of patterned and etched layer 16 of metal, forming a contact pad over the surface of this exposure 18, a wire bond connection that establishes electrical contact between the contact pad 16 and surrounding circuitry (not shown).

The composition of layers 14, 15 and 16 has been previously discussed and can be summarized as follows:

layer 14 can comprise a compound layer of Cr/Cu/Ni where the layer of Cu forms the bulk, low-resistance layer of metal, the lower layer of Cr provides adhesion to the overlying layer of Cu and the upper layer of Ni protects the surface of the layer of copper, and layers 15 and 16 can comprise a compound layer of Cr/Cu/Ni/Au where the layer of copper provides the bulk, low-resistance layer of metal, the lower layer of Cr provides adhesion to the overlying layer of Cu and the underlying polyimide, the layer of Ni overlying the layer of Cu serves as a diffusion barrier layer while the upper layer of Au is the wire-bondable layer of metal.

FIGS. 6 through 10 show specific methods and structures for the thick, heavy interconnect scheme and the wire-bonding pad of the invention. These methods and structures will now discussed in detail. It must thereby be kept in mind that the invention provides for a post-passivation interconnect scheme for the interconnections to external circuits. This interconnect to external circuits is typically provided by methods of solder bonding. The significant difference between conventional methods of interconnecting to external circuits is that the invention combined a new, post-passivation interconnect scheme with using wire-bonding techniques. In this manner, the invention solves the problem of typically experiences high IR voltage drop across inter-connect lines. A significant aspect of the invention is further that it allows the application of widely available wire-bonding infrastructure and thereby negates the need for relatively expensive methods of solder bonding flip chips.

The cross sections that are shown in FIGS. 5 through 10 focus on using a wire bonding approach for creating a chip and by applying post-passivation interconnections for the connection of the device to external circuits. The post-passivation can be a single layer of metal or can comprise multiple layers of metal. A first layer of metal in the post-passivation process is typically on the surface of a thick layer of dielectric. For purposes of cost-reduction, this first layer of metal can also be created directly overlying the surface of the layer of passivation.

Only the upper-most layer of metal that is created using the post-passivation scheme of the invention must provide a metal configuration that has both low resistance and good wire bonding capabilities. Lower lying layers of metal need only provide low resistance interconnects and can therefore comprise a bulk metal such as copper that is typified by low-resistance. The invention provides special insight into the creation of the upper-most layer of metal, which must have both low-resistance and good wire bonding capabilities.

For purposes of low-resistance, the invention provides a bulk metal such as Cu, Au, Al and the like. For wire-bonding purposes, the invention provides a metal of good wire-bonding characteristics such as Au, Al and the like.

Where Au or Al is used as the interconnect metal, the metal scheme is relatively simple since both of these metals have low-resistance and good wire-bonding characteristics. This will be further highlighted using the cross section of FIG. 6 and FIG. 9 for Au and Al, respectively.

Where Cu is used as the interconnect metal, in view of the low-resistance of Cu, a layer of wire-bondable metal such as Au or Al is additionally required. For this application, a layer of diffusion barrier material, such as Ni, is required between the layer of Cu and the overlying layer of Au. In addition, a adhesion layer, for instance comprising Cr, is required between the layer of Cu and the underlying layer of dielectric (polyimide). This will be further highlighted using the cross section of FIGS. 7 and 8.

Specifically referring to the cross section that is shown in FIG. 6, the following elements of this structure are highlighted:

- 40, the cross section of the surface of a silicon substrate
- 42, active semiconductor devices that have been created in or on the surface of substrate 40
- 60, a layer of dielectric in and through which fine-line interconnect wires have been created; these interconnect wires make contact with the underlying active semiconductor devices 42 and have in addition been provided with points of electrical contact or top metal in the surface of layer 60
- 10, top metal that has been provided in the surface of layer 60, making contact with the fine-line interconnect wires that have been created in layer 60
- 62, a layer of passivation deposited over the surface of layer 60, including the surface of top metal contact 10
- 11 a first thick layer of dielectric; this layer 11 of dielectric is created over the surface of layer 62 of passivation; for purposes of-cost-reduction, the first layer 11 of dielectric can be omitted in some applications
- 19 and 20, layers of patterned and etched metal forming a bonding pad/low resistance interconnect layer. The upper layer 20 comprises a selected metal which is selected for purposes of providing low-resistance interconnect while this layer can simultaneously be used for wire-bonding purposes, preferably using Au or Al. The lower layer 19 is used for purposes of adhesion to the layer of dielectric as well as for forming a diffusion layer to the contact pad 10.

The processing flow that is provided for the creation of the structure that has been shown in cross section in FIG. 6 is as follows:

1. conventionally performing Front-Of-Line (FOL) processing, comprising processing of layer 42 of active semiconductor devices, layer 60 of fine-line interconnect metal thereby including the creation of top metal 10 and layer 62 of passivation
2. patterning and etching an opening through the layer 62 of passivation, this opening being aligned with a portion of the top metal 10, exposing the surface of top metal 10; it is clear that where at this time only one opening is indicated, the invention is not limited to the creation of one opening through the layer 62 of passivation but can create as many openings as are desired for a device layout
3. depositing a first layer 11 of dielectric, preferably comprising polyimide; for purposes of cost reduction, this layer can be omitted in some applications
4. patterning and etching the deposited first layer 11 of dielectric, creating an opening through this first layer of dielectric; this opening being aligned with the opening that has been created through the layer 62 of passivation, making this opening being aligned with a portion of the layer 10 of top metal
5. successively creating layers of barrier metal such as TiW (layer 19) over which a layer (layer 20) of Au or Al is created, preferably using the method of metal sputtering for the creation of these layer 19 of metal; it must specifically be noted that layer 19 is a composite sputtered layer comprising about 3,000 Angstrom of TiW and about 1,000 Angstrom of Au; layer 20 is a thick layer of Au created by using electroplating techniques; layer 20 is therefore not only used as a bond pad but can additionally be used for interconnect wiring; these latter comments further emphasize that the invention provides for the creation of a metal system that can be simultaneously used for the creation of conductive interconnect traces and for wire bonding purposes; it must as a consequence be pointed out that aspects of separately creating either interconnect traces or wire bond pads are not addressed or provided for by the invention
6. creating an exposure mask, preferably comprising photoresist, over the surface of sputtered layers 19, this mask exposing these layers over a surface area of the metal layers 19 that is to form as a metal system that can be simultaneously used for low resistance conduction and wire bonding, this mask exposing the surface areas where the wiring and the bond pad are required
7. applying a Au plating to the exposed surface of the layer 19; layer 20 is therefore not only used as a bond pad but can additionally be used for interconnect wiring; these latter comments further emphasize that the invention provides for the creation of a metal system that can be simultaneously used for the creation of conductive interconnect traces and for wire bonding purposes; it must as a consequence be pointed out that aspects of separately creating either interconnect traces or wire bond pads are not addressed or provided for by the invention
8. removing the exposed photoresist, and
9. etching layers 19 using the plated Au is a mask. Thus, a metal system has been created for low-resistance interconnects and for wire-bonding purposes.

The cross section that is shown in FIG. 6 is an application of the invention where Au or Al is used as the interconnect metal. As previously pointed out, the metal scheme is relatively simple since both of these metals have low-resistance and good wire-bonding characteristics. The layer of Cu or Al forms the low-resistance interconnect layer while this metal can also be used for good wire-bonding purposes. A Au layer can be created using conventional electroplating technology. In addition, since Au is an inert metal, a layer of Au does not require an overlying layer of polyimide.

For subsequent cross sections of FIG. 7 through 10, a number of the elements of the structure and therefore a number of the related processing steps are commonly valid and will therefore not be repeated. The processing steps however, in view of the importance of these step, will, for each of the cross sections of FIG. 7 through 10, be restated.

Figure 7:
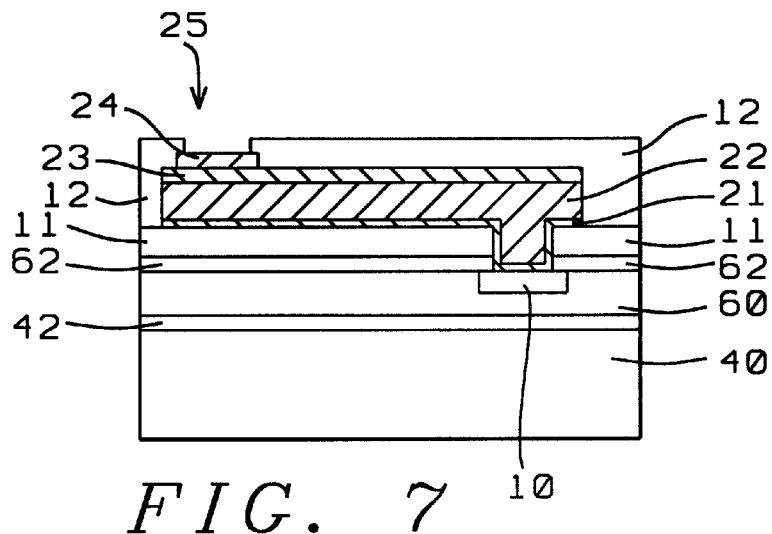

For the cross section that is shown in FIG. 7, layers 40 through and including layer 11 are as previously highlighted under FIG. 6. FIG. 7 has, in addition to or differing with the elements that have been highlighted under FIG. 6, the following elements:

- 21, a first layer of metal, preferably comprising Cr or Ti or TiW or a compound thereof; layer 21 serves as an adhesion layer between the overlying layer 22 of Cu and the underlying layer 11 of dielectric; a thin layer of copper (not shown) is subsequently sputtered over the surface 21 to serve as a seed layer for the electroplating of layer 22, layer 22 is not yet formed at this time
- 22, a second layer of metal of the bond pad, preferably comprising Cu or a Cu compound, selected for its low-resistance characteristics
- 23, a third layer of metal of the bond pad, preferably comprising Ni or a Ni compound
- 12, a second layer of dielectric, an opening 25 has been created through this layer of dielectric, exposing the surface of layer 23 for the creation of the fourth layer 24 of metal of the bond pad, and
- 24, a fourth layer of metal of the bond pad, preferably comprising Au or an Au compound.

The processing flow that is provided for the creation of the structure that has been shown in cross section in FIG. 7 is as follows:
1. conventionally performing Front-Of-Line (FOL) processing, comprising processing of layer 42 of active semiconductor devices, layer 60 of fine-line interconnect metal thereby including the creation of top metal 10 and layer 62 of passivation
2. patterning and etching an opening through the layer 62 of passivation, this opening is to be aligned with a portion of the top metal 10, exposing the surface of top metal 10
3. depositing a first layer 11 of dielectric, preferably comprising polyimide; in some applications, this layer of dielectric can be omitted for reasons of cost-reduction
4. patterning and etching the deposited first layer 11 of dielectric, creating an opening through this first layer of dielectric; this opening is to be aligned with the opening that has been created through the layer 62 of passivation making this opening being aligned with a portion of the layer 10 of top metal
5. creating layers 21 (comprising Cr or Ti or TiW) and a layer of Cu (not shown), preferably using the method of metal sputtering for the creation of these layers of metal
6. creating an exposure mask, preferably comprising photoresist, over the surface of sputtered layers 21, this mask exposing these layers over a surface area of the metal layer 21 that is to form as a bond pad, this mask further covering all surface areas of the layer 22 that are not serving as a bond pad
7. applying a Cu plating (not shown in FIG. 7) to the exposed surface of the layer 21
8. applying a Ni plating to the copper plated surface of layers 22, creating layer 23
9. removing the exposed photoresist, and
10. etching layer 21 essentially in accordance with the applied Ni and Cu plating, leaving in place layer 21 where the Ni plating (layer 22 and 23) has been applied, thereby leaving in place layers 21, 22 and 23 that serve as low-resistance interconnection, exposing the surface of layer 23, further exposing the surface of the first layer 11 of dielectric
11. depositing a second layer 12 of dielectric, preferable comprising polyimide, over the exposed surface of layer 23 and the exposed surface of the first layer 11 of dielectric
12. patterning and etching the deposited second layer 12 of dielectric, creating an opening through the second layer 12 of dielectric that aligns with the patterned and etched layers 21, 22 and 23, exposing the surface of layer 23, and
13. performing electroless gold plating to the exposed surface of layer 23, creating bond pad 24.

Figure 8:
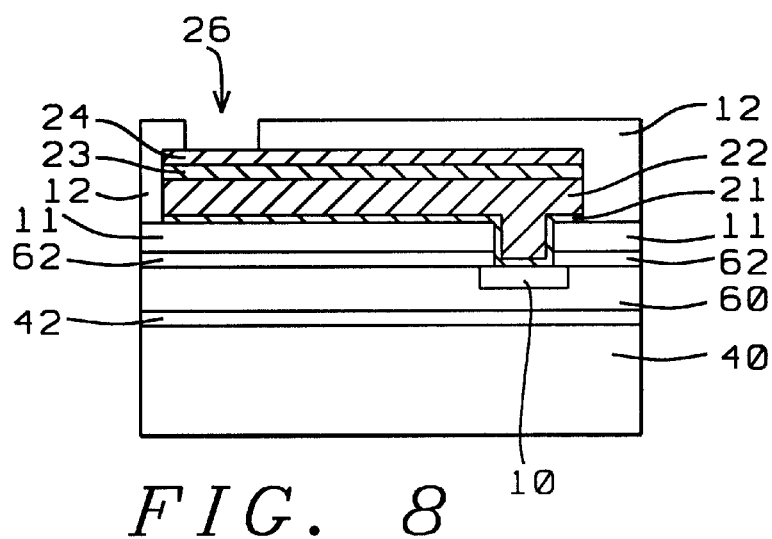

The cross section that is shown in FIG. 8 has the basic elements that have been highlighted under FIG. 7, these basic elements have however been processed in a different manner, which will become clear in following the processing flow as this processing flow applies to the cross section of FIG. 8.

The processing flow that is provided for the creation of the structure that has been shown in cross section in FIG. 8 is as follows:
1. conventionally performing Front-Of-Line (FOL) processing, comprising processing of layer 42 of active semiconductor devices, layer 60 of fine-line interconnect metal thereby including the creation of top metal 10 and layer 62 of passivation
2. patterning and etching an opening through the layer 62 of passivation, this opening is to be aligned with a portion of the top metal 10, exposing the surface of top metal 10
3. depositing a first layer 11 of dielectric, preferably comprising polyimide; this layer of dielectric can be omitted in some applications
4. patterning and etching the deposited first layer 11 of dielectric, creating an opening through this first layer 11 of dielectric; this opening is to be aligned with the opening that has been created through the layer 62 of passivation making this opening being aligned with a portion of the layer 10 of top metal
5. creating a layer 21 of Cr or Ti or TiW, preferably using the method of metal sputtering for the creation of these layers of metal; a thin layer of copper (not shown) is sputtered over the surface of layer 21 to serve as a seed layer for the electroplating of overlying layer 22, layer 22 is not yet formed at this time
6. creating a exposure mask, preferably comprising photoresist, over the surface of sputtered layer 21, this mask exposing this layer over a surface area of the metal layer 21 that is to form as the low resistance interconnection and a bond pad, this mask further covering all surface areas of the layer 21 that are not serving as a bond pad
7. applying a Cu plating to the exposed surface of the layers 21, creating layer 22
8. applying a Ni plating to the exposed surface of the layers 22, creating layer 23
9. applying a Au plating to the exposed surface of the layers 23, creating layer 24; this essentially creates a three layered mask of layers 21 (over which a thin layer of copper, not shown, has been sputtered), 22 and 23
10. removing the exposure mask
11. etching layers 21 (and the thereover sputtered thin layer of copper) essentially in accordance with the applied Au plating, leaving in place layers 21, 22, 23 and 24 where the Au plating has been applied, thereby leaving in place layers 21, 22, 23 and 24 that serve as the low resistance interconnection and a bond pad, exposing the surface of layer 24, further exposing the surface of the first layer 11 of dielectric
12. depositing a second layer 12 of dielectric, preferable comprising polyimide, over the exposed surface of layer 24 and the exposed surface of the first layer 11 of dielectric
13. patterning and etching the deposited second layer 12 of dielectric, creating an opening 26 through the second layer 12 of dielectric that aligns with a portion of the patterned and etched layers 21, 22, 23 and 24, exposing the surface of layer 24.

Figure 9:
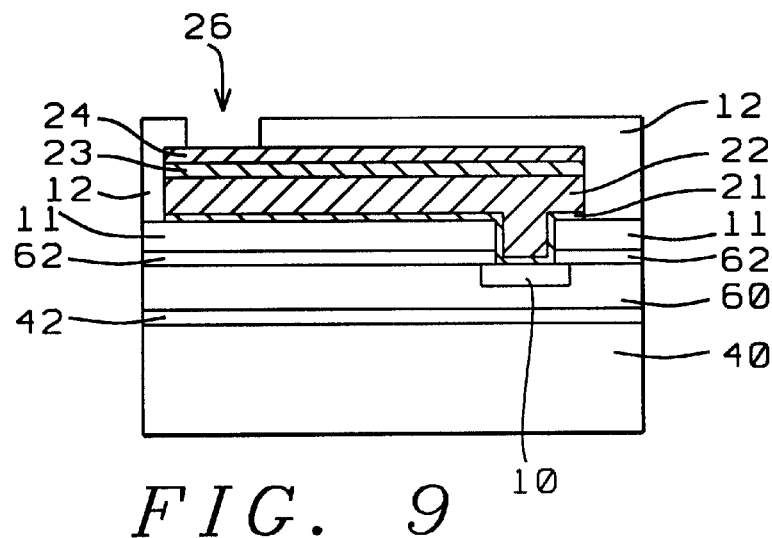

The cross section that is shown in FIG. 9 has the simplest metal system, a thick sputtered layer of Al is used in this case.

The processing flow that is provided for the creation of the structure that has been shown in cross section in FIG. 9 is as follows:
1. conventionally performing Front-Of-Line (FOL) processing, comprising processing of layer 42 of active semiconductor devices, layer 60 of fine-line interconnect metal thereby including the creation of top metal 10 and layer 62 of passivation
2. patterning and etching an opening through the layer 62 of passivation, this opening is to be aligned with a portion of the top metal 10, exposing the surface of top metal 10
3. depositing a first layer 11 of dielectric, preferably comprising polyimide; in some applications, this layer of dielectric can be omitted for cost reasons
4. patterning and etching the deposited first layer 11 of dielectric, creating an opening through this first layer of dielectric; this opening is to be aligned with the opening that has been created through the layer 62 of passivation making this opening being aligned with a portion of the layer 10 of top metal 5. creating a layer 21 of Al; this layer of Al is thicker than 1 $\mu$m and is preferably created using methods of metal sputtering
6. creating an exposure mask, preferably comprising photoresist, over the surface of sputtered Al layer 21; this mask exposes a surface area except the surface of the Al layer 21 that is to form a low-resistance interconnection and a bond pad, this mask further covering all surface areas of the metal layer that are not serving as a bond pad
7. etching the Al metal layer in accordance with the exposure mask, preferably using wet etching
8. removing the exposure mask
9. depositing a second layer 12 of dielectric, preferable comprising polyimide, over the exposed surface of layer 24 and the exposed surface of the first layer 11 of dielectric
10. patterning and etching the deposited second layer 12 of dielectric, creating an opening 26 through the second layer 12 of dielectric that aligns with a portion of the patterned and etched layer 21, exposing the surface of layer 24, the exposed surface of layer 24 serving as a bond pad.

Figure 10:
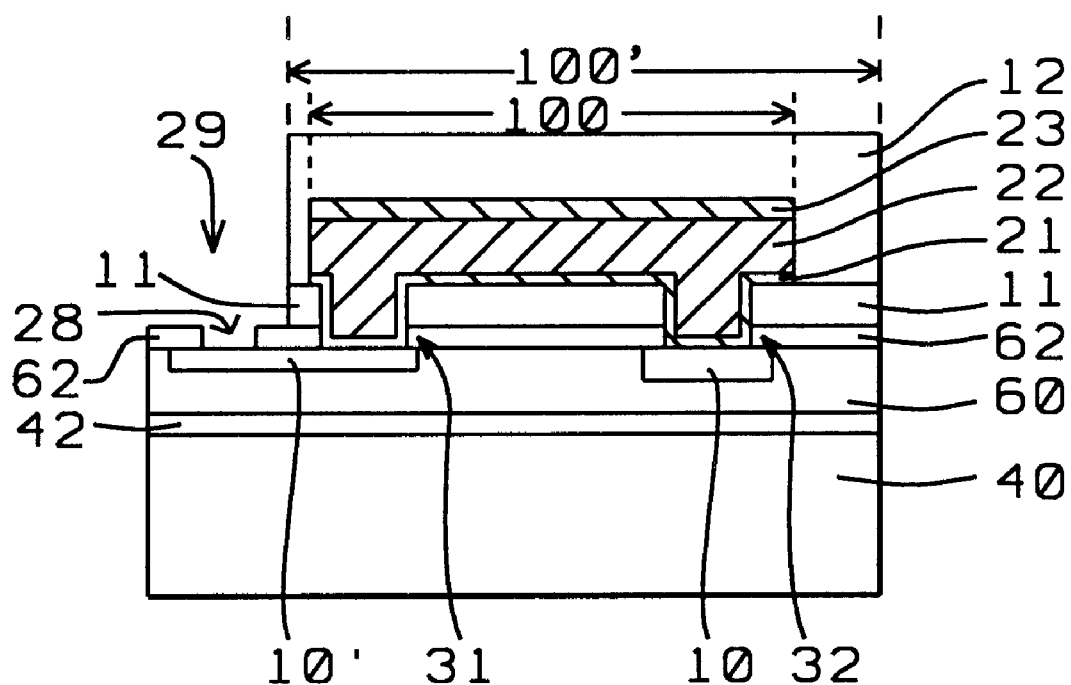

The cross section that is shown in FIG. 10 has the basic elements that have been highlighted under FIG. 7, these basis elements have however processed in a different manner which will become clear in the following processing flow as this processing flow applies to the cross section of FIG. 10.

The processing flow that is provided for the creation of the structure that has been shown in cross section in FIG. 10 is as follows:

1. conventionally performing Front-Of-Line (FOL) processing, comprising processing of layer 42 of active semiconductor devices, layer 60 of fine-line interconnect metal thereby including the creation of top metal 10 and 10' and layer 62 of passivation; top metal 10 and 10' is a metal that is wire-bondable
2. patterning and etching openings 28, 31 and 32 through the layer 62 of passivation, openings 28 and 31 to be aligned with a portion of the top metal 10', exposing the surface of top metal 10'; opening 32 to be aligned with a portion of the top metal 10, exposing the surface of top metal 10
3. depositing a first layer 11 of dielectric, preferably comprising polyimide; in some applications, this layer of dielectric can be omitted
4. patterning and etching the deposited first layer 11 of dielectric, creating openings through this first layer of dielectric; these openings are to be aligned with the openings 28, 31 and 32
5. creating a layer 21 of TiW or Ti or Cr over which a thin layer of Cu (not shown) is created; the thin layer of copper (not shown) serves as a seed layer for the electroplating of an overlying layer
6. creating an exposure mask, preferably comprising photoresist, to expose area 100; area 100 can be an interconnecting network covering a large portion of the chip area, connecting to areas 10', a portion of which forms a wire bonding pad exposed through opening 28; the length of area 100 can be large since low resistance interconnect metal is used, while 10' should be short since higher resistance metal is used
7. applying a Cu plating 22 to the exposed surface of the layer 21 in area 100
8. applying a Ni plating 23 to the exposed surface of the layers 22 in area 100
9. removing the exposure mask
10. etching (the thin layer of copper, not shown) and layer 21 of TiW using the patterned layers 22 and 23 as a mask, for this etch a $H_2O_2$ is used, thereby avoiding etch damage to the surface of layer 10' of aluminum in the bond pad 28
11. depositing a second layer 12 of dielectric, preferably comprising polyimide, over the complete surface of the wafer
12. patterning and etching the layer 12 of dielectric outside area 100', to open region 29, exposing the surface of the bond pad exposed through opening 28.

The invention has provided methods and structures for creating thick, heavy layers of interconnect metal connected with bond pads over the surface of a conventional layer of passivation. The invention has further provided processing sequences for the creation of the bond pads and the thick heavy layers of metal.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A post passivation interconnect structure, comprising:
    one or more internal circuits comprising one or more active devices formed in and on a semiconductor substrate;
    a fine line metallization system, formed over said semiconductor substrate in one or more thin layers of dielectric;
    a passivation layer over said fine line metallization system;
    a thick, wide metallization system formed above said passivation layer, wherein said thick, wide metallization system is used as a distribution network for a clock or signal voltage, and wherein said thick, wide metallization system is connected to said one or more internal circuits; and
    at least one wire-bondable bond pad created over said thick layers of dielectric, said at least one bond pad being connected with said thick, wide metallization system.

2. The interconnect structure of claim 1 wherein said distribution network is connected to said one or more internal circuits by vias, which are formed through said passivation layer, and through said one or more thin layers of dielectric.

3. The interconnect structure of claim 1 wherein said distribution network acts as a global distribution for said clock or signal voltages, and said vias are further connected to local clock or signal distribution networks, respectively, formed in said fine line metallization system.

4. The interconnect structure of claim 1 wherein said distribution network acts as a global distribution for said power and ground voltages, and said vias are further connected to local power and ground distribution networks, respectively, formed in said fine line metallization system.

5. The interconnect structure of claim 1 wherein metal in said thick, wide metallization system is greater than about 1 micrometer in thickness.

6. The interconnect structure of claim 1 wherein said thick, wide metallization system formed above said layer of passivation comprises one or more thick layers of dielectric, said thick layers of dielectric each having a thickness greater than about 2 micrometers.

7. A method for creating a post passivation interconnect structure, comprising:

provrding one or more internal circuits comprising one or more active devices formed in and on a semiconductor substrate;

providing a fine line metallization system, formed over said semiconductor substrate in one or more thin layers of dielectric;

providing a passivation layer over said fine line metallization system;

providing a thick, wide metallization system formed above said passivation layer, in one or more thick layers of dielectric, wherein said thick layers of dielectric are thicker than said thin layers of dielectric, wherein said thick, wide metallization system is used as a distribution network for a clock or signal voltage, and wherein said thick, wide metallization system is connected to said one or more internal circuits; and providing at least one wire-bondable bond pad created over said thick layers of dielectric, said at least one wire-bondable bond pad being connected with said thick, wide metallization system.

8. The method of claim 7 wherein said distribution network is connected to said one or more internal circuits by vias, which are formed through said one or more thick layers of dielectric, through said passivation layer, and through said one or more thin layers of dielectric.

9. The method of claim 7 wherein said distribution network acts as a global distribution for said clock or signal voltages, and said vias are further connected to local clock or signal distribution networks, respectively, formed in said fine line metallization system.

10. The method of claim 7 wherein said distribution network acts as a global distribution for said power and ground voltages, and said vias are further connected to local power and ground distribution networks, respectively, formed in said fine line metallization system.

11. The method of claim 7 wherein metal in said thick, wide metallization system is greater than about 1 micrometer in thickness.

12. The method of claim 7 wherein said thick, wide metallization system formed above said layer of passivation comprises one or more thick layers of dielectric, said thick layers of dielectric each having a thickness greater than about 2 micrometers.

13. The method of claim 7, wherein said providing at least one bond pad over said post-passivation interconnection structure comprises the steps of:

providing a substrate, active devices having been created in or on the substrate, a layer of fine-line interconnect metal including top metal being connected to said active devices having been provided over the substrate, a layer of passivation having been provided over the layer of fine-line interconnect metal;

patterning and etching an opening through the layer of passivation, this opening being aligned with a portion of said top metal, exposing top metal;

successively creating a first layer of metal comprising TiW over which a second layer metal comprising Au is created, preferably using the method of metal sputtering for the creation of these layers;

creating an exposure mask, preferably comprising photoresist, over the sputtered second layer of metal comprising Au, this mask exposing the second layer of metal over a surface area that is to form the low-resistance interconnection and the wire-bondable bond pad;

applying a bulk metal plating to the exposed surface of the second layer of metal comprising Au;

removing the exposure mask, and etching the second layer of metal comprising Au and the first layer of metal comprising TiW in accordance with the plated layer of bulk metal, leaving in place the first and the second layers of metal where the bulk metal plating has been applied, thereby providing a metal system serving as both low-resistance conduction and wire-bonding pads.

14. The method of claim 13, with additional processing steps being performed prior to said successively creating a first layer of metal comprising TiW over which a second layer of metal comprising Au is created, said additional steps comprising:

depositing a first layer of dielectric, over said layer of passivation, including said opening created through said layer of passivation; and patterning and etching the deposited first layer of dielectric, creating an opening through this first layer of dielectric, this opening being aligned with the opening that has been created through the layer of passivation.

15. The method of claim 13, said bulk metal being selected from the group consisting of Au and Al.

16. The method of claim 7, wherein said providing at least one bond pad over said post-passivation interconnection structure comprises the steps of:

providing a substrate, active devices having been created in or on the substrate, a layer of fine-line interconnect metal having been provided over the substrate, at least one layer of patterned top metal having been provided over the layer of fine-line interconnect metal, said at least one layer of patterned top metal having been connected to said layer of fine-line interconnect metal, a layer of passivation having been provided over the layer of fine-line interconnect metal;

patterning and etching at least one first opening through the layer of passivation, said at least one first opening being aligned with a portion of said at least one layer of top metal, exposing said at least one layer of top metal;

creating a first layer of metal, serving as a diffusion barrier and an adhesion layer, over said layer of passivation, preferably using metal sputtering for the creation of the first layer of metal;

creating an second layer of seed metal for subsequent processing of electroplating, preferably using methods of metal sputtering;

creating an exposure mask, preferably comprising photoresist, over the sputtered second layer of metal, said exposure mask exposing the second layer of metal over a surface area of the second layer of metal that is to form a low resistance interconnection;

applying a first metal plating to the exposed surface of the second layer of metal, creating a third layer of metal to form a low-resistance interconnection over the exposed surface area of the second layer of metal;

applying a second metal plating to the exposed surface of the third layer of metal, creating a fourth layer of metal to form a diffusion barrier over the surface area of the third layer of metal;

removing the exposure mask;

etching the first and second layers of metal in accordance with the applied third and fourth metal plating, thereby leaving in place the first, the second, the third and the fourth layers of metal that serve as diffusion barrier, electroplating seed layer, low-resistance layer and diffusion barrier respectively;

depositing a second layer of dielectric, preferable comprising polyimide, over the exposed surface of the fourth layer of metal and the exposed surface of said layer of passivation;

patterning and etching said deposited layer of dielectric, creating an opening through said layer of dielectric that aligns with a portion of the patterned and etched first, second, third and fourth layers of metal, exposing the fourth layer of metal; and applying a third metal plating to the exposed surface of the fifth layer of metal, preferably using electroless plating, creating a bond pad.

17. The method of claim 16, said first layer of metal comprising an adhesive material between said first layer of dielectric and said second layer of metal.

18. The method of claim 17, said first layer of metal being selected from the group consisting of Cr and Ti and TiW.

19. The method of claim 16, said third layer of metal comprising a low-resistance metal.

20. The method of claim 19, said low-resistance metal being selected from the group consisting of Cu and Au and Al and W and Ag.

21. The method of claim 16, said first metal plating providing a protective surface over said layer of second layer of metal.

22. The method of claim 16, said fourth layer of metal comprising a metal serving as a diffusion barrier between said third layer of metal and said fifth layer of metal.

23. The method of claim 16, said third metal plating comprising Au plating.

24. The method of claim 7, wherein said providing at least one bond pad over said post-passivation interconnection structure comprises the steps of:

providing a substrate, active devices having been created in or on the substrate, a layer of fine-line interconnect metal having been provided over the substrate, at least one layer of patterned top metal having been provided over the layer of fine-line interconnect metal, said at least one layer of patterned top metal having been connected to said layer of fine-line interconnect metal, a layer of passivation having been provided over the layer of fine-line interconnect metal;

patterning and etching at least one first opening through the layer of passivation, said at least one first opening being aligned with a portion of said at least one layer of top metal, exposing said at least one layer of top metal;

creating a first layer of metal over said layer of passivation, preferably using the method of metal sputtering for the creation of this layer of metal;

sputtering a thin second layer over the first layer of metal, said second layer serving as a electroplating seed layer;

creating a exposure mask, preferably comprising photoresist, over the sputtered second layer of metal, said exposure mask exposing said second layer of metal over a surface area that is to serve as a low-resistance interconnection and a bond pad;

creating a third layer of metal over the exposed surface of the second layer of metal;

creating a fourth layer of metal over the exposed surface of the third layer of metal;

creating a fifth layer of metal over the exposed surface of the fourth layer of metal;

removing the exposure mask;

etching the first and the second layers of metal in accordance with the created fifth layer of metal, leaving in place the first, second, third, fourth and fifth layers of metal where the fifth layer of metal has been applied, these layers serving as a low-resistance interconnection and a bond pad, exposing the fifth layer of metal, further exposing the layer of passivation;

depositing a layer of dielectric, preferable comprising polyimide, over the exposed surface of the fifth layer of metal and the exposed surface of the layer of dielectric of passivation;

patterning and etching the deposited second layer of dielectric, creating an opening through the second layer of dielectric that aligns with a portion of the patterned and etched first, second, third, fourth and fifth layers of metal, exposing the fifth layer of metal, creating a bond pad.

25. The method of claim 24, said first layer of metal comprising a layer of adhesion material between said passivation layer and said third layer of metal.

26. The method of claim 25, said adhesion material comprising a metal being selected from the group consisting of Cr and Ti and TiW.

27. The method of claim 24 said thin second layer of metal comprising a seed layer for electroplating of said third layer of metal.

28. The method of claim 27, said seed layer preferably comprising copper.

29. The method of claim 24 said third layer of metal preferably comprising a low-resistance metal.

30. The method of claim 29, said low-resistance metal being selected from the group consisting of Cu and Au and Al and Ag and W.

31. The method of claim 24, said fourth layer of metal providing a layer serving as surface protection for said third layer of metal and a diffusion barrier between said third layer of metal and said fifth layer of metal.

32. The method of claim 31 said fourth layer of surface protection comprising Ni.

33. The method of claim 24, said fifth layer of metal comprising a wire-bondable metal.

34. The method of claim 33 said wire-bondable metal comprising a metal selected from the group consisting of Au and Al.

35. The method of claim 7, wherein said providing at least one bond pad over said post-passivation interconnection structure comprises the steps of:

providing a substrate, active devices having been created in or on the substrate, a layer of fine-line interconnect metal having been provided over the substrate, at least one layer of patterned top metal having been provided over the layer of fine-line interconnect metal, said at least one layer of patterned top metal having been connected to said layer of fine-line interconnect metal, a layer of passivation having been provided over the layer of fine-line interconnect metal;

patterning and etching at least one first opening through the layer of passivation, said at least one first opening being aligned with a portion of said at least one layer of top metal, exposing said at least one layer of top metal;

depositing a first layer of dielectric over said layer of passivation, including at least one opening created through said layer of passivation, said first layer of dielectric preferably comprising polyimide;

patterning and etching the deposited first layer of dielectric, creating at least one second opening through this first layer of dielectric, said at least one second opening being aligned with said at least one first opening through the layer of passivation;

creating a layer of metal over said first layer of dielectric including inside surfaces of said second opening created through said first layer of dielectric, preferably using the method of metal sputtering for the creation of this layer of metal;

creating an exposure mask, preferably comprising photoresist, over the sputtered layer of metal, said exposure mask covering this layer over a surface area of the metal layer that is to serve as a low-resistance interconnection and a bond pad;

etching the layer of metal in accordance with the exposure mask, exposing said first layer of dielectric;

removing the exposure mask, exposing said layer of metal;

depositing a second layer of dielectric, preferable comprising polyimide, over the exposed surface of the fourth layer of metal and the exposed surface of the first layer of dielectric; and patterning and etching the deposited second layer of dielectric, creating an opening through the second layer of dielectric that aligns with a portion of the patterned and etched layer of metal, exposing the layer of metal, the exposed surface of the layer of metal serving as a bond pad.

36. The method of claim 35, said layer of metal comprising aluminum.

37. The method of claim 13, whereby first layer of metal comprises a metal selected from the group consisting of adhesion and diffusion barrier metals.

38. The method of claim 14, said first layer of dielectric comprising a polymer.

39. The method of claim 14, said first layer of dielectric comprising a material selected from the group consisting of polyimide and silicon elastomer and benzocyclobutane.

40. The method of claim 16, additionally providing prior to said step of creating a first layer of metal over said layer of passivation the steps of:

depositing a first layer of dielectric over said layer of passivation, including the at least one first opening created through said layer of passivation, said first layer of dielectric preferably comprising polyimide; and patterning and etching the deposited first layer of dielectric, creating at least one second opening through this first layer of dielectric, said at least one second opening being aligned with said at least one first opening through the layer of passivation.

41. The method of claim 17, said second layer of metal comprising a metal serving as an electroplating seed layer for subsequent electroplating of said third layer of metal.

42. The method of claim 17, said second layer of metal comprising copper.

43. The method of claim 7, wherein said providing at least one bond pad over said post-passivation interconnection structure comprises the steps of:

providing a substrate, active devices having been created in or on the substrate, a layer of fine-line interconnect metal having been provided over the substrate, at least one layer of patterned top metal having been provided over the layer of fine-line interconnect metal, said at least one layer of patterned top metal having been connected to said layer of fine-line interconnect metal, a layer of passivation having been provided over the layer of fine-line interconnect metal;

patterning and etching at least one first opening through the layer of passivation, said at least one first opening being aligned with a portion of said at least one layer of top metal, exposing said at least one layer of top metal;

creating a layer of metal over said passivation layer, preferably using the method of metal sputtering for the creation of this layer of metal;

creating an exposure mask, preferably comprising photoresist, over the sputtered layer of metal, said exposure mask covering this layer over a surface area of the metal layer that is to serve as a low-resistance interconnection and a bond pad;

etching the layer of metal in accordance with the exposure mask, exposing said layer of passivation;

removing the exposure mask, exposing said layer of metal;

depositing a layer of dielectric, preferably comprising polyimide, over the exposed surface of said layer of metal and the exposed surface of the layer of passivation; and patterning and etching the deposited layer of dielectric, creating an opening through the layer of dielectric that aligns with a portion of the patterned and etched layer of metal, exposing the layer of metal, the exposed surface of the layer of metal serving as a bond pad.

44. A method for creating a post passivation interconnect structure, comprising:

providing a substrate, active devices having been created in or on the substrate, a layer of fine-line interconnect metal including top metal being connected to said active devices having been provided over the substrate, said top metal comprising wire-bondable metal, said top metal comprising at least one first portion of top metal which comprises a bond pad, said top metal further comprising at least one second portion of top metal that needs to be connected to said first portion of top metal, a layer of passivation having been provided over the layer of fine-line interconnect metal;

patterning and etching a first, second and a third opening through the layer of passivation, said first opening being aligned with a portion of said first portion of top metal, said second opening being aligned with a portion of said first portion of top metal, said third opening being aligned with a portion of said second portion of top metal, exposing said first and second portion of top metal;

depositing a first layer of dielectric, preferably comprising polyimide, over said layer of passivation, including said first, second and third openings created in said layer of passivation;

patterning and etching the deposited first layer of dielectric, creating a fourth, a fifth and a sixth openings through said first layer of dielectric, said fourth opening through said first layer of dielectric being aligned with said first opening created through said layer of passivation, said fifth and sixth openings through said first layer of dielectric respectively being aligned with said second and third openings created through the layer of passivation;

creating a first layer metal over said first layer of dielectric, creating a second layer of metal serving as seed layer over said first layer of metal;

creating an exposure mask, preferably comprising photoresist, over the created second layer of metal, exposing the second layer of metal only over the surface area of the second layer of metal at least in a region over and between said second and third opening while not exposing said first opening;

creating a patterned third layer of metal over the exposed surface of the second layer of metal;

creating a patterned fourth layer of metal over the patterned third layer of metal;

removing the exposure mask, exposing the second layer of metal, leaving in place a mask of the patterned third and fourth layers of metal in place overlying the second layer of metal;

etching the second and the first layers of metal in accordance with the masking of third and fourth layers of metal overlying these second and first layers of metal, through selection of an etchant to avoid etch damage to said top metal in said bond pad, thereby exposing said bond pad and a portion of said passivation layer and said first layer of dielectric;

depositing a second layer of dielectric over the patterned fourth layer of metal and the first layer of dielectric, preferably comprising polyimide; and patterning and etching the deposited second layer of dielectric, creating an opening through the second layer of dielectric that aligns with said bond pad.

45. The method of claim 44, said first layer of metal providing an adhesion layer between said first layer of dielectric and said second layer of metal in addition to providing a diffusion barrier metal between said top metal and said second and third layer of metal.

46. The method of claim 45, said adhesion layer comprising a material selected from the group consisting of Ti and Cr and TiW.

47. The method of claim 44, said second layer of metal comprising a seed layer for said third layer of metal.

48. The method of claim 47, said second layer of metal comprising Cu.

49. The method of claim 44, said patterned third layer of metal comprising a low-resistance metal.

50. The method of claim 49, said low-resistance metal comprising an element selected from the group consisting of Cu and Au and Al and W and Ag.

51. The method of claim 44, said patterned fourth layer of metal comprising a protective metal for the third layer of metal.

52. The method of claim 51, said protective metal comprising Ni.

53. The method of claim 7, wherein said providing at least one bond pad over said post-passivation interconnection structure comprises the steps of:

providing a substrate, active devices having been created in or on the substrate, a layer of fine-line interconnect metal including at least one layer of top metal being connected to said active devices having been provided over the substrate, a layer of passivation having been provided over the layer of fine-line interconnect metal;

patterning and etching at least one first opening through the layer of passivation, said at least one first opening being aligned with a portion of said at least one layer of top metal, exposing said at least one layer of top metal;

depositing a first layer of dielectric, preferably comprising polyimide;

patterning and etching the deposited first layer of dielectric, creating at least one second opening through this first layer of dielectric, said at least one second opening being aligned with said at least one first opening created through the layer of passivation;

creating a first layer of metal over said first layer of dielectric including inside surfaces of said at least one second opening created through said first layer of dielectric;

patterning said first layer of metal, creating at least one pattern of said first layer of metal contacting said at least one layer of top metal;

depositing a second layer of dielectric over said first layer of dielectric, including said at least one pattern of said first layer of metal;

creating at least one third opening through the second layer of dielectric, said at least one third opening being aligned with a portion of said at least one pattern of said first layer of metal;

creating a second layer of metal over said second layer of dielectric including inside surfaces of said at least one third opening created through said second layer of dielectric;

patterning said second layer of metal, creating at least one pattern of said second layer of metal contacting said at least one pattern of first layer of metal;

depositing a third layer of dielectric over said second layer of dielectric, including said at least one pattern of said second layer of metal;

creating at least one fourth opening through the third layer of dielectric, said at least one fourth opening being aligned with a portion of said at least one pattern of said second layer of metal, exposing said at least one pattern of said second layer of metal.

54. The method of claim 53, wherein said first layer of metal comprising a low-resistance metal.

55. The method of claim 54, said low-resistance metal being selected from the group consisting of Cu and Au and Al and W and Ag.

56. The method of claim 53, wherein said second layer of metal comprising a first layer of low-resistance metal over which a second layer of wire-bondable material is deposited.

57. The method of claim 56, said low-resistance metal being selected from the group consisting of Cu and Au and Al and W and Ag.

58. The method of claim 56, said wire-bondable material being selected from the group consisting of Au and Al.

59. The method of claim 53, additionally providing an adhesive layer between said first layer of dielectric and said first layer of metal.

60. The method of claim 53, additionally providing a protective layer of said first layer of metal.

61. The method of claim 53, additionally providing an adhesive layer between said second layer of dielectric and said second layer of metal.

62. The method of claim 53, additionally providing a protective layer of said second layer of metal.

63. The method of claim 24 additionally providing prior to said step of creating a first layer of metal over said first layer of dielectric the steps of:

depositing a first layer of dielectric over said layer of passivation, including the at least one opening created through said layer of passivation, said first layer of dielectric preferably comprising polyimide; and patterning and etching the deposited first layer of dielectric, creating at least one second opening through this first layer of dielectric, said at least one second opening being aligned with said at least one first opening through the layer of passivation.

64. The method of claim 7, wherein said providing at least one bond pad over said post-passivation interconnection structure comprises the steps of:

providing a substrate, active devices having been created in or on the substrate, a layer of fine-line interconnect metal including top metal being connected to said active devices having been provided over the substrate, said top metal comprising wire-bondable metal, said top metal comprising at least one first portion of top metal comprising a bond pad, said top metal further comprising at least one second portion of top metal that needs to be connected to said first portion of top metal, a layer of passivation having been provided over the layer of fine-line interconnect metal;

patterning and etching a first, second and third opening through the layer of passivation, said first opening being aligned with a portion of said first portion of top metal, said second opening being aligned with a portion of said first portion of top metal, said third opening being aligned with a portion of said second portion of top metal, exposing said first and second portion of top metal;

creating a first layer of metal over said passivation layer, creating a second layer of metal serving as a seed layer over said first layer of metal;

creating an exposure mask, preferably comprising photoresist, over the created second layer of metal, exposing the second layer of metal only over the surface area of the second layer of metal at least on the region over and between said second and third opening, and not exposing said first opening;

creating a patterned third layer of metal over the exposed surface of the second layer of metal;

creating a patterned fourth layer of metal over the patterned third layer of metal;

removing the exposure mask, exposing the second layer of metal, leaving in place a mask of the patterned third and fourth layers of metal in place overlying the second layer of metal;

etching the second and the first layers of metal in accordance with the mask of third and fourth layers of metal overlying the second and third layers of metal, thereby avoiding etch damage to said top metal in said bond pad, thereby exposing the passivation layer;

depositing a layer of dielectric over the patterned fourth layer of metal and the layer of passivation, preferably comprising polyimide; and patterning and etching the deposited layer of dielectric, creating an opening through the layer of dielectric that aligns with said bond pad.

65. The method of claim 7, wherein said providing at least one bond pad over said post-passivation interconnection structure comprises the steps of:

providing a substrate, active devices having been created in or on the substrate, a layer of fine-line interconnect metal including at least one layer of top metal being connected to said active devices having been provided over the substrate, a layer of passivation having been provided over the layer of fine-line interconnect metal;

patterning and etching at least one first opening through the layer of passivation, said at least one first opening being aligned with a portion of said at least one layer of top metal, exposing said at least one layer of top metal;

creating a first layer of metal over said passivation layer;

patterning said first layer of metal, creating at least one pattern of said first layer of metal contacting said at least one layer of top metal;

depositing a first layer of dielectric over said layer of passivation, including said at least one pattern of said first layer of metal;

creating at least one third opening through the first layer of dielectric, said at least one third opening being aligned with a portion of said at least one pattern of said first layer of metal;

creating a second layer of metal over said first layer of dielectric including inside surfaces of said at least one third opening created through said first layer of dielectric;

patterning said second layer of metal, creating at least one pattern of said second layer of metal contacting said at least one pattern of first layer of metal;

depositing a second layer of dielectric over said first layer of dielectric, including said at least one pattern of said second layer of metal;

creating at least one fourth opening through the second layer of dielectric, said at least one fourth opening being aligned with a portion of said at least one pattern of said second layer of metal, exposing said at least one pattern of said second layer of metal.

66. A method of forming post passivation interconnect structure, comprising:

providing one or more internal circuits comprising one or more active devices formed in and on a semiconductor substrate;

providing a fine line metallization system, formed over said semiconductor substrate in one or more thin layers of dielectric;

providing a passivation layer over said fine line metallization system;

providing a thick, wide metallization system formed above said passivation layer, in one or more thick layers of dielectric, wherein said thick layers of dielectric are thicker than said thin layers of dielectric, wherein said thick, wide metallization system is used as a distribution network for a clock or signal voltage, and wherein said thick, wide metallization system is connected to said one or more internal circuits; and providing at least one wire-bondable bond pad adjacent to said thick layers of dielectric, said at least one wire-bondable bond pad being connected with said thick, wide metallization system.

67. The method of claim 66 wherein said at least one wire-bondable bond pad is formed from a top layer of said fine line metallization system.

68. The method of claim 67 wherein said at least one wire-bondable bond pad is exposed through said passivation layer.

69. The method of claim 66 wherein said at least one wire-bondable bond pad is connected to said thick, wide metallization system through said fine line metallization system and through openings in said passivation layer.

* * * * *